US006760577B2

(12) United States Patent
Li

(10) Patent No.: US 6,760,577 B2
(45) Date of Patent: Jul. 6, 2004

(54) ALIGNMENT METHODS AND APPARATUS FOR I/Q PHASE AND AMPLITUDE ERROR CORRECTION AND IMAGE REJECTION IMPROVEMENT

(75) Inventor: Frank Xiaohui Li, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 594 days.

(21) Appl. No.: 09/821,367

(22) Filed: Mar. 29, 2001

(65) Prior Publication Data

US 2002/0177425 A1 Nov. 28, 2002

(51) Int. Cl.[7] .................................................. H04B 1/26
(52) U.S. Cl. .................... 455/323; 455/67.13; 455/209; 329/304
(58) Field of Search .................................. 455/323, 326, 455/333, 337, 296, 63.1, 67.11, 67.13, 114.2, 115.1, 209, 237.1, 260; 329/304, 306, 307; 332/103; 331/11, 15, 18

(56) References Cited

U.S. PATENT DOCUMENTS

| 4,717,894 A | | 1/1988 | Edwards et al. ............... 332/20 |
|---|---|---|---|
| 4,802,191 A | * | 1/1989 | McGeehan et al. .......... 375/270 |
| 5,623,226 A | | 4/1997 | Whitmarsh et al. ............. 330/2 |
| 5,923,214 A | * | 7/1999 | Mitzlaff ........................ 330/52 |
| 5,937,000 A | * | 8/1999 | Lee et al. ..................... 375/141 |
| 5,956,624 A | * | 9/1999 | Hunsinger et al. ............. 455/65 |
| 6,650,868 B1 | * | 11/2003 | Karabinis ................... 455/12.1 |

FOREIGN PATENT DOCUMENTS

EP          0 265 218 B1    4/1988

* cited by examiner

Primary Examiner—Tony T. Nguyen
(74) Attorney, Agent, or Firm—Blakely, Sokoloff, Taylor & Zafman LLP

(57) ABSTRACT

Alignment methods and apparatus for I/Q phase and amplitude error correction and image rejection improvement that may be used at the time of circuit fabrication or on chip for use during operation. The alignment method may be used to improve the I/Q phase and amplitude accuracy of a direct conversion transceiver or to improve image rejection in an up or downconversion mixer. For alignment purposes, a pilot tone of a selected frequency is used to provide a calibration reference, with adjustments being made in phase and amplitude to drive the I and Q phase and amplitude mismatch toward a minimum.

67 Claims, 6 Drawing Sheets

ALIGNMENT METHODS AND APPARATUS FOR I/Q PHASE AND AMPLITUDE ERROR CORRECTION AND IMAGE REJECTION IMPROVEMENT

BACKGROUND OF THE INVENTION

1. Field of the Invention

The present invention relates to the field of communications.

2. Prior Art

Various data communication systems modulate data onto inphase and quadrature components of a baseband signal and then mix those baseband components with inphase and quadrature components of an RF carrier to broadcast the modulated data in a single sideband of the RF carrier. Upon receipt of the broadcast signal, the reverse process is carried out, first receiving the broadcast signal, then downconverting to recover the inphase and quadrature components of the modulated baseband signal, and then recovering the data from those inphase and quadrature components.

In the prior art systems, techniques are known for recovering the data from the modulated signals, such as by use of one or more local oscillators. These techniques, in general, are sufficiently accurate to be relatively insensitive to phase errors, or reasonable frequency errors in the case of locally generated mixing frequencies. However, they are sensitive to misalignment or non-orthogonality of the inphase and quadrature modulated baseband signals in a degree dependent on the modulation technique and data rate. To decrease the data error rate, it is desirable to maintain the non-orthogonality to a low level commensurate with the modulation technique and data rates used.

A typical prior art system is illustrated in a simple block diagram form in FIG. 1. A reference frequency REF is applied to a phase-locked loop (PLL) phase comparator which compares the reference frequency and phase with the output of a divider receiving an input from a voltage controlled oscillator (VCO) to provide an error signal to a low pass filter LF, providing the voltage control to the voltage controlled oscillator. Thus the output frequency and phase is smoothly controlled by programming the divider.

The output of the VCO is used to create inphase (0°) and quadrature (90°) components that drive mixers MR1 and MT2, and MR2 and MT1, respectively. An incoming RF signal RF_IN is downconverted by mixers MR1 and MR2 to provide inphase and quadrature components IR and QR of a baseband signal, that is then passed to a demodulator (not shown) for recovery of the data signal therein. In the case of a transmitted signal, the inphase and quadrature components IT and QT of the baseband data signal are mixed with the output of the VCO by mixers MT1 and MT2 and combined to provide the radio frequency output RF_OUT.

FIG. 2 illustrates a prior art system similar to FIG. 1, though with the inphase and quadrature components of the baseband signal IR and QR of FIG. 1 combined by an additional quadrature combiner to provide a single output signal IRM_OUT to the intermediate frequency processor. This structure is called an image rejection mixer. Also the inphase and quadrature components for input to mixers MT1 and MT2 for transmission purposes are derived from an intermediate frequency signal IRM_IN. This structure is called a single sideband upconverter mixer.

BRIEF SUMMARY OF THE INVENTION

Alignment methods and apparatus for I/Q phase and amplitude error correction and image rejection improvement that may be used at the time of circuit fabrication or on chip for use before receiving or transmitting a signal. The alignment method may be used to improve the I/Q phase and amplitude accuracy of a direct conversion transceiver or multi-conversion transceiver, or to improve image rejection in up or down conversion mixers. For I/Q (inphase/quadrature) mismatch correction of an upconverter (MT1, MT2), one can couple a small portion of the output signal from an upconverter to an I/Q mismatch monitoring downconverter whose local oscillator frequency is programmed for monitoring the downconverter to produce a low frequency output whose amplitude is proportional to the unwanted sideband of the upconverter. The higher frequency components at the output of the I/Q mismatch monitoring downconverter are filtered out. For I/Q mismatch correction of a downconverter without a quadrature combiner at the output, a pilot tone of a frequency in the desired signal band is injected into the downconverter input. This pilot tone signal mixes with a quadrature local oscillator frequency to produce inphase and quadrature outputs that interface with analog to digital converters directly. Any inphase or quadrature amplitude or phase mismatch will be detected in the digital signal processor circuit. For I/Q mismatch correction of a downconverter with a quadrature combiner at the output, one can inject a pilot tone in the image band and use a log detector amplifier after the quadrature combiner to monitor the image signal level indicating the inphase and quadrature phase and amplitude levels.

DETAILED DESCRIPTION OF THE PREFERRED EMBODIMENT

The present invention alignment methods and apparatus for I/Q (inphase and quadrature) phase and amplitude error correction and image rejection improvement may be used in various ways. By way of example, the invention may be used in portable communication devices for alignment of the transmission and receive channels each time the portable communication device is turned on. Alternatively, the invention may be used for alignment of transmit and receive channels each time the respective channel is switched on. In that regard, the alignment process itself in accordance with the present invention may typically be completed very rapidly, thereby not occupying significant transmit and receive time. The present invention may also be used for one-time phase and amplitude error correction and image rejection improvement at the time of integrated circuit manufacture, making permanent corrections through techniques such as, by way of example, laser trimming.

Figure 3:
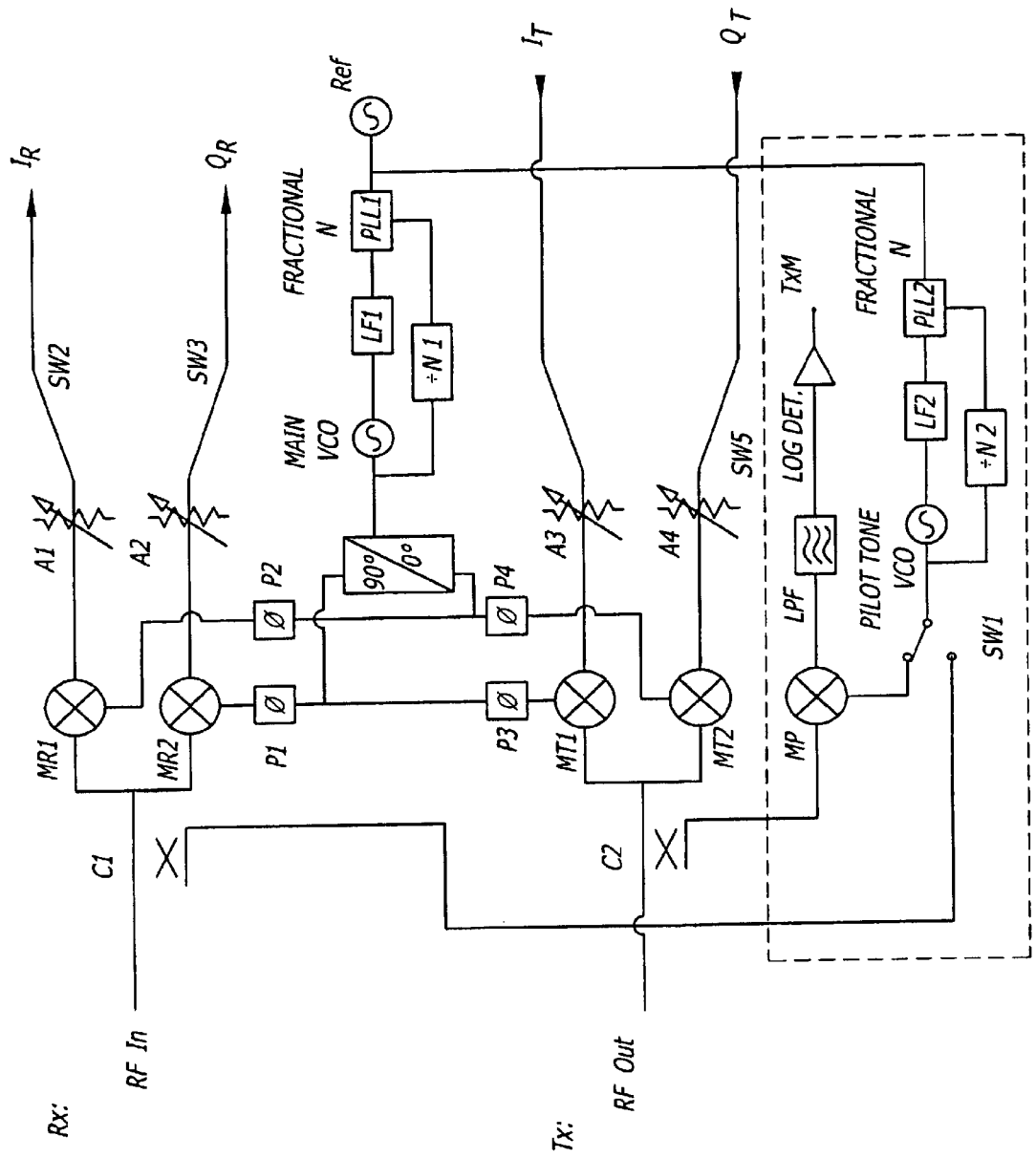
FIG. 3 is a block diagram of a direct conversion transmit and receive integrated circuit incorporating the present invention into a direct conversion transmit and receive integrated circuit.

Now referring to FIG. 3, a block diagram of a direct conversion transmit and receive integrated circuit incorporating the present invention in a direct conversion transmit and receive integrated circuit may be seen. As in FIG. 1, the radio frequency signal RF_IN is downconverted by mixing with inphase and quadrature components of a frequency derived from a phase locked loop synthesizer referenced to Ref to provide the baseband signal components IR and QR for data recovery. However the baseband signal components IR and QR may be scaled by the variable attenuators A1 and A2, respectively. Also the inphase and quadrature components of the frequency derived from the phase locked loop synthesizer referenced to Ref may be adjusted in phase around their nominal relative phase by controllable phase shifters P2 and P1, respectively. Further, the frequency itself derived from the phase locked loop synthesizer referenced to Ref, for the exemplary embodiment, is derived using a fractional N phase-locked loop.

Figure 1:
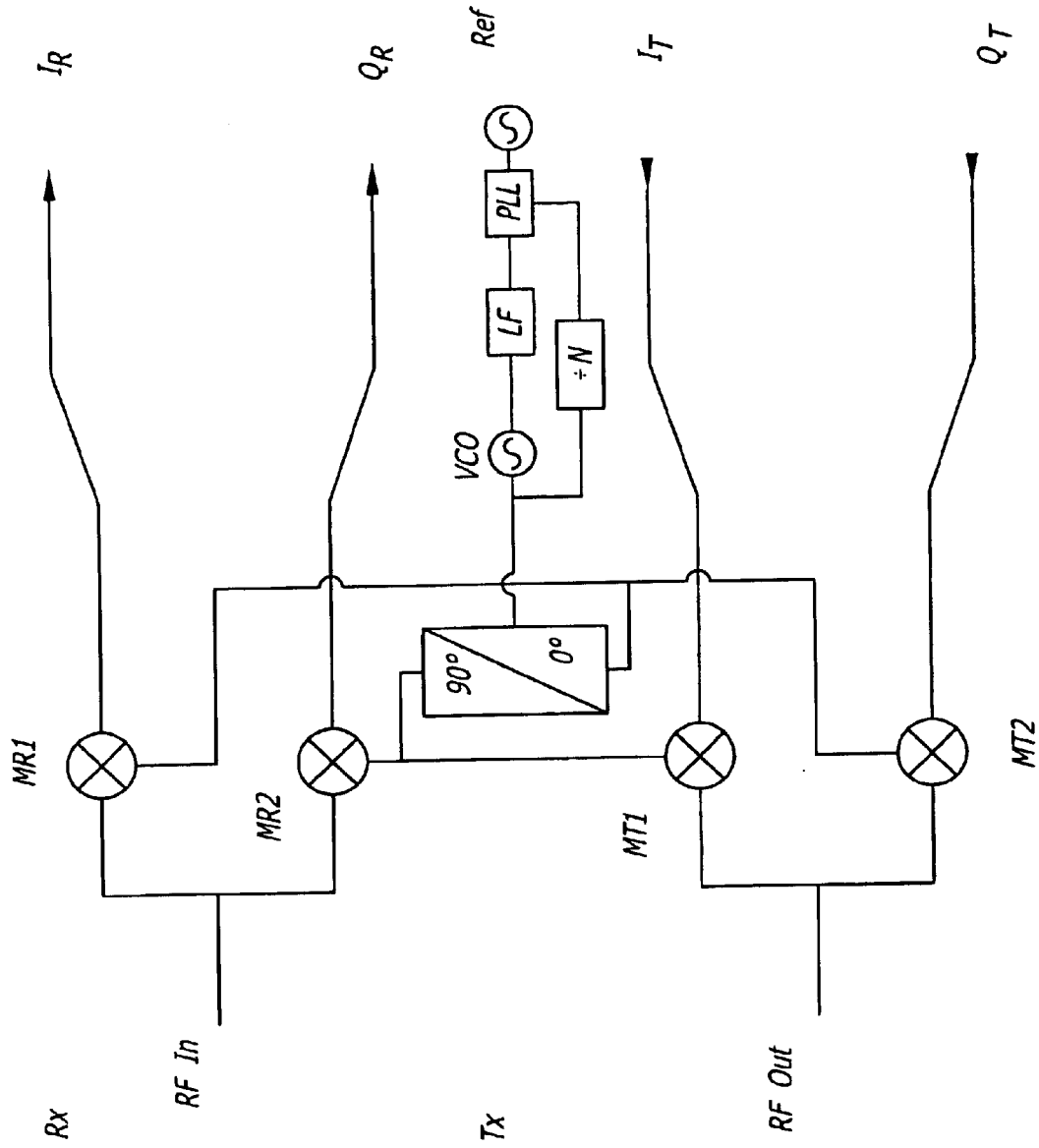
FIG. 1 is a block diagram of a typical prior art system.
Figure 2:
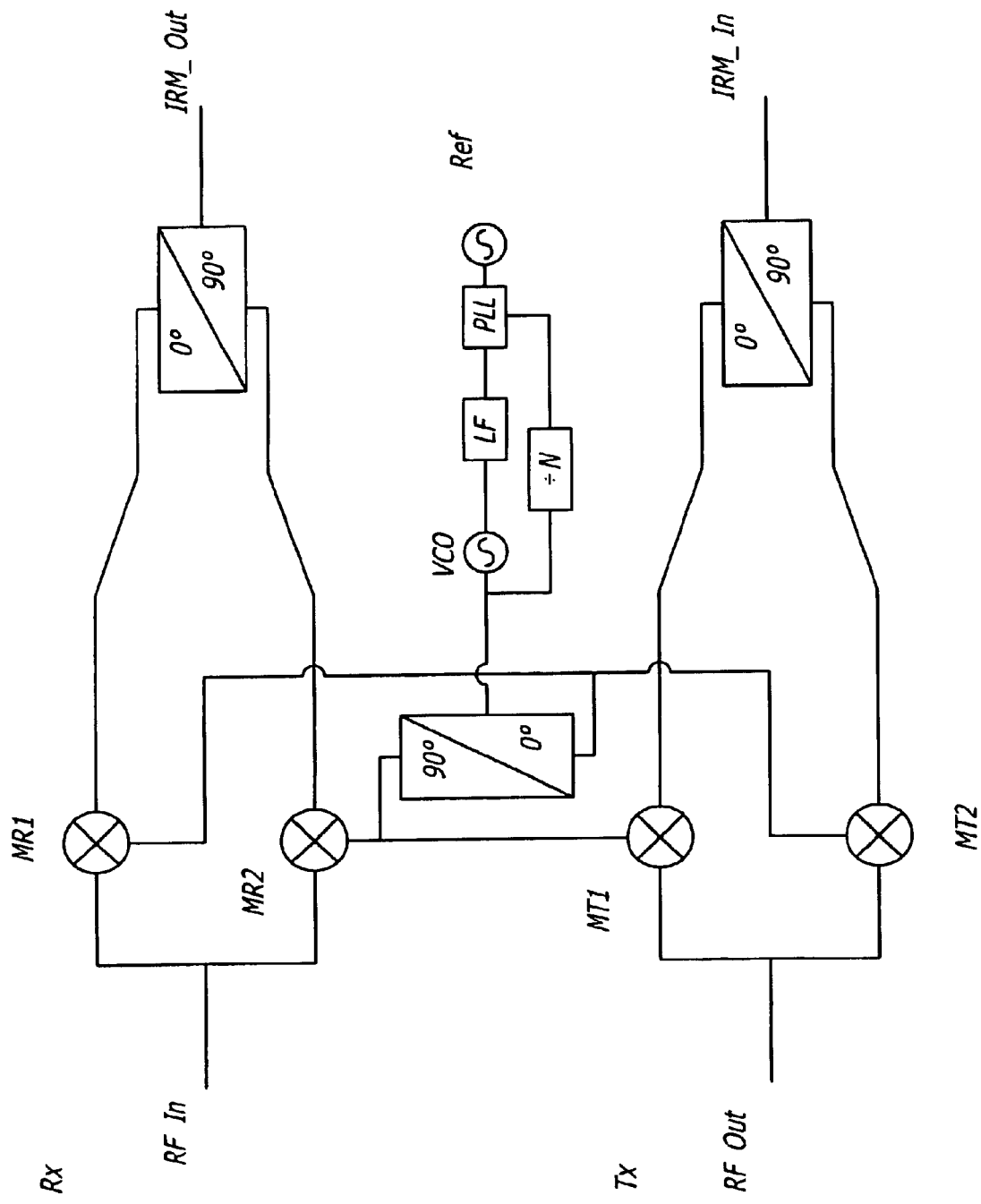
FIG. 2 is a block diagram of a prior art system similar to FIG. 1, though with the inphase and quadrature components of the baseband signal IR and QR of FIG. 1 combined to provide a single output signal IRM_OUT to the demodulator.

With respect to the outgoing radio frequency signal, as in FIG. 1, the baseband signal components IT and QT are upconverted by mixing with inphase and quadrature components of a frequency derived from a phase locked loop synthesizer referenced to Ref and combined to provide the RF output RF_OUT. However the baseband signal components IT and QT may be adjusted in amplitude by the variable attenuators A3 and A4, respectively, before the mixing, and the inphase and quadrature components of the frequency derived from the phase locked loop synthesizer referenced to Ref may be adjusted in phase around their nominal relative phase by controllable phase shifters P3 and P4, respectively.

The alignment method of the present invention may be best explained by first considering the nature of the input and output signals of the mixers MR1 and MR2 and the mixers MT1 and MT2, and the effect misalignment has on those signals. In particular, consider the signals provided to the mixers MT1 and MT2 to be orthogonal. More specifically, consider a sinusoidal baseband signal at 5 megahertz. Also, assume for the moment that the variable attenuators A3 and A4 are of equal gain, mixers MT1 And MT2 are ideal mixers and the phase adjust circuits P3 and P4 provide perfect inphase and quadrature components of the broadcast frequency. Under these conditions, the inputs to the mixers MT1 and MT2 may be expressed as:

$a * \cos(2\pi f_1 t)$ and $a * \sin(2\pi f_1 t)$ where:
  a=the amplitude of each of the two components (the two amplitudes being equal in the ideal situation)
  $f_1$=the baseband frequency (5 megahertz in the exemplary embodiment)
  t=time These components are mixed by the inphase and quadrature components of the broadcast frequency (5.X gigahertz in the exemplary embodiment), namely $\cos(2\pi f_2 t)$ and $-\sin(2\pi f_2 t)$, where $f_2$ is the broadcast carrier frequency (5 gigahertz in this example).

This provides as the output of the upconverter, the sum of these two components:

$$a\cos(2\pi f_1 t)\cos(2\pi f_2 t) = \frac{a}{2}\cos((2\pi f_1 - 2\pi f_2)t) + \frac{a}{2}\cos((2\pi f_1 + 2\pi f_2)t)$$

$$-a\sin(2\pi f_1 t)\sin(2\pi f_2 t) = \frac{-a}{2}\cos((2\pi f_1 - 2\pi f_2)t) + \frac{a}{2}\cos((2\pi f_1 + 2\pi f_2)t)$$

It will be noted from the foregoing equations that when the two equations are combined in the upconverter (MT1 and MT2), the two components in the lower sideband ($f_1-f_2$) will cancel, whereas the two components in the upper sideband ($f_1+f_2$) will add, providing a single sideband signal, namely the upper sideband. Alternatively, of course, the phase of any one (or three) of the four signals could be reversed, namely, the inphase component or the quadrature component of the baseband signal or the inphase component or the quadrature component of the broadcast frequency provided to the upconverter, in which case the upper sideband components would cancel and the lower sideband components would add, to provide the lower single sideband only.

Figure 5:
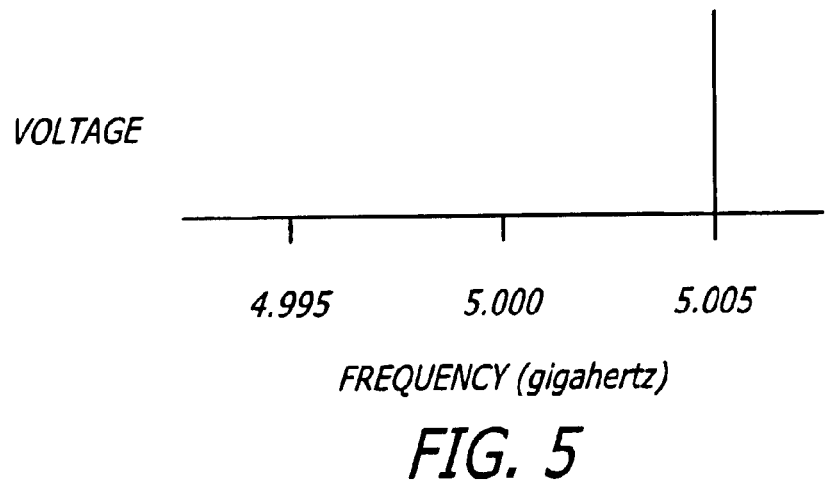
FIG. 5 is amplitude versus frequency plot for the RF signal from a perfect converter resulting from a sinusoidal baseband signal.

The exemplary embodiment using the upper sideband for broadcast purposes, and with the baseband signal but no data signal in that baseband signal for alignment purposes, may be illustrated in the amplitude versus frequency plot of FIG. 5, wherein it may be seen that all of the broadcast power is at the frequency $f_1+f_2$. Again for specificity, in the exemplary embodiment, a broadcast frequency of 5 gigahertz and a baseband frequency of 5 megahertz are assumed, in which case all of the broadcast power would be concentrated at a frequency of 5.005 gigahertz. (With a signal present, the signal information would be in sidebands of that upper sideband frequency.)

Referring to the foregoing equations, it will be noted that if the amplitudes of the upconverted inphase and quadrature components are not equal, the components in the lower sideband will not fully cancel, leaving what is referred to as a replica image of the desired signal. Further, consider the effect of some undesired phase shift induced in either the inphase or quadrature modulated signals. By way of example, suppose because of some imperfection, the quadrature mixer signal $2\pi f_2 t$ had a phase shift, so as to be $2\pi f_2 t+\theta$, where $\theta$ is the phase shift. In this case, the following equation would apply.

$$-a\sin(2\pi f_1 t)\sin(2\pi f_2 t + \theta) =$$
$$\frac{-a}{2}\cos((2\pi f_1 - 2\pi f_2)t - \theta) + \frac{a}{2}\cos((2\pi f_1 + 2\pi f_2)t + \theta)$$

Now the inphase and quadrature components in the upper sideband, when added in the upconverter, will have some phase shift because of the presence of the phase shift $\theta$. However, the inphase and quadrature components in the lower sideband, not being fully out of phase with each other, will not fully cancel, again leaving a replica image of the desired sideband. These effects are illustrated in FIG. 6, again using a 5 gigahertz broadcast frequency and a 5 megahertz baseband frequency for the example.

Note also from the last equation that the phase shift $\theta$ associated with the broadcast frequency $f_2$ could be compensated for by imposing an equal and opposite phase shift in that component of the broadcast frequency provided to the upconverter, or alternatively, by imposing an equal phase shift in the quadrature component of the baseband frequency $f_1$, as either would cancel the phase shift in the associated component of the lower sideband. Accordingly, regardless of the cause of the phase shift, the effect of a phase shift may be canceled by appropriate phase adjustment of the inphase and quadrature broadcast frequency signals provided to the quadrature upconverter by the phase adjust circuits P3 and P4. Similarly, differences in the amplitude of the inphase and quadrature components of the lower sideband may be eliminated by the independent adjustment of the variable attenuators A3 and A4.

Referring again to FIG. 3, a reference oscillator provides a reference frequency Ref to circuits identified in the Figure as fractional N phase-locked loops. The first fractional N phase-locked loop contains the main VCO. In the exemplary embodiment, the RF carrier is a 5.X gigahertz carrier having channels spaced 20 megahertz apart, such as at 5.0 gigahertz, 5.020 gigahertz, 5.040 gigahertz, etc. In this case, the reference frequency may be, by way of example, 5 or 10 megahertz, so that a fractional N phase-locked loop is not required because of the RF carrier frequencies being integer multiples of the reference frequency. However the corresponding pilot tone frequencies in the exemplary embodiment would be 4.9949 gigahertz, 5.0149 gigahertz, 5.0349 gigahertz, etc., clearly not integer multiples of a reference frequency such as 5 or 10 megahertz. Consequently, while the phase-locked loop generating the RF carrier may or may not be a fractional phase-locked loop, depending generally on the specific RF frequencies used, normally the pilot tone phase-locked loop will be a fractional phase-locked loop. However, other combinations of phase-locked loops may be used dependent on the frequencies desired, such as, by way of example, a fractional phase-locked loop for the RF carrier generation and not for the pilot tone generation.

The second or pilot tone fractional phase-locked loop of FIG. 3 contains a pilot tone VCO, the output of which may be coupled through switch SW1 to a pilot tone mixer MP or as an RF_IN signal through coupler C1. In the exemplary embodiment being described herein, the pilot tone phase-locked loop just described provides an output at a frequency of 5.1 megahertz below the broadcast carrier frequency. Thus, by way of example, if the broadcast carrier frequency is set at 5 gigahertz, then the pilot tone phase-locked loop would provide a frequency of 4.9949 gigahertz for the alignment process.

Figure 6:
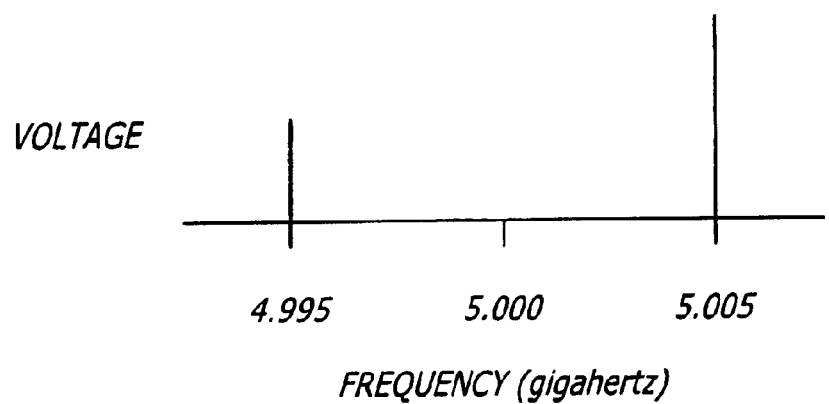
FIG. 6 is an amplitude versus frequency plot for the RF signal from a imperfect converter resulting from a sinusoidal baseband signal.
Figure 7:
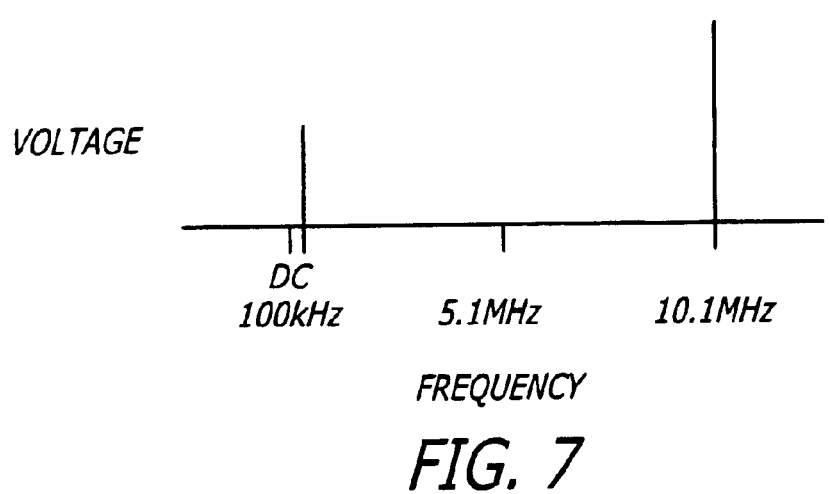
FIG. 7 is an amplitude output versus frequency plot for a monitoring converter using a pilot tone in accordance with the present invention.

Consider first the alignment of the transmitting section, wherein inphase and quadrature components of a 5 megahertz signal are provided as the signals IT and QT and mixer by the RF carrier by mixers MT1 and MT2. Assuming the RF carrier is at 5 gigahertz, the spectrum of RF_OUT is shown in FIG. 6. During this time, a small portion of the output signal RF_OUT is coupled from the main signal path through coupler C2 to the transmit I/Q mismatch monitoring mixer MP. The pilot tone mixer MP mixers the combined output of mixers MT1 and MT2 with the pilot tone PLL signal to produce the spectrum shown on FIG. 7. Because the 5 megahertz baseband signal is not modulated by a data signal during the alignment procedure, the upper sideband, which in this example is the desired sideband, will be 5.1 megahertz above the baseband signal, or at 10.1 megahertz. The lower sideband, which represents the undesired replica image, will be 10 megahertz below the upper sideband, or at 100 Khertz.

These downconverted signals are low pass filtered by a 100 Khertz low pass filter LPF to eliminate the upper sideband and the carrier leakage, leaving only the unwanted replica image. The replica image passing through the 100 Khertz low pass filter LPF is fed to a log detector in the preferred embodiment to provide a DC output T×M as a measure of the sideband rejection.

The actual alignment process is an iterative process for the phase and amplitude adjustments for the phase adjust circuits P3 and P4 and variable attenuators A3 and A4, respectively. In this process, one of the parameters (A3, A4, P3 or P4) is changed and the change in the output of the log detector is noted. If the change reduces the replica image (reduces the output of the log detector), additional changes are made in that parameter until the replica image is not being further reduced. If the initial change in a parameter increases the replica image, the parameter is incremented in the opposite direction and the reduction noted, etc., until further reductions in the replica image are not noted. Then the next parameter is similarly incremented, etc., cycling through all four parameters (two phase shifts and two amplitude adjustments) a few times to get the best alignment reasonably achievable. Typically, the range of control on the phase adjust circuits and on the amplitude adjust circuits need not be particularly large, as large angle or large amplitude corrections are not normally required.

For the receive channel, consider the effect of injecting into the downconverter (MR1 and MR2) as a receive signal, a pilot tone that is close in frequency to the RF carrier frequency, namely $a*\cos(2\pi f_1 t)$, where now a is the amplitude of the pilot tone and $f_1$ is the pilot tone frequency. The pilot tone is mixed by the inphase and quadrature components of the RF frequency (5.X gigahertz in the exemplary embodiment), namely $\cos(2\pi f_2 t)$ and $-\sin(2\pi f_2 t)$, where $f_2$ is the RF frequency (5 gigahertz in this specific example).

For a perfect system, this would provide as the output of the downconverter $$IR = a\cos(2\pi f_1 t)\cos(2\pi f_2 t) =$$
$$\frac{a}{2}\cos((2\pi f_1 - 2\pi f_2)t) + \frac{a}{2}\cos((2\pi f_1 + 2\pi f_2)t)$$
$$QR = -a\cos(2\pi f_1 t)\sin(2\pi f_2 t) =$$
$$\frac{a}{2}\sin((2\pi f_1 - 2\pi f_2)t) - \frac{a}{2}\sin((2\pi f_1 + 2\pi f_2)t)$$

The components in the upper sideband ($f_1+f_2$) will be out of the pass band of the receive channel and can be neglected. Therefore only the difference frequency components need be considered. For an imperfect system, the difference frequency components (lower sideband) may be expressed as:

$$IR = \frac{a_1}{2}\cos((2\pi f_1 - 2\pi f_2 + \theta_1)t)$$
$$QR = \frac{a_2}{2}\sin((2\pi f_1 - 2\pi f_2 + \theta_2)t)$$

where:
$a_1$, $a_2$=unequal amplitudes of the downconverted signals in the two channels
$\theta_1$, $\theta_2$=unequal phase shifts of the downconverted signals in the two channels In the exemplary embodiment, if the magnitude of the frequency difference $|f_1-f_2|$ is 5 megahertz, the lower sideband signals IR and IQ will be 5 megahertz sinusoidal baseband signals. These 5 megahertz sinusoidal baseband signals are detectable by the digital signal processing circuitry normally used for data recovery, allowing A1, A2, P1 and P2 to be adjusted to make $a_1=a_2$ and $\theta_1=\theta_2$. It is not necessary to adjust the phase shift so that $\theta_1=\theta_2=0$. In that regard, the ability to adjust P1 and P2 would allow such an adjustment, but there is no local reference to base such an adjustment on. Therefore both P1 and P2 do not need to be adjusted, though if only one of them is adjustable, twice the range of adjustment would be needed to provide the same total relative adjustment in phase between IR and QR. For the example of a system using a 5.X gigahertz RF carrier and a 5 megahertz baseband signal, $|f_1-f_2|$ will be 5 megahertz if the pilot tone frequency is 5 megahertz below or 5 megahertz above the RF carrier frequency.

For the alignment of the receive channel, an iterative process is carried out using the phase adjust circuits P1 and P2 and the amplitude adjust circuits A1 and A2. In this case, again with the antenna disconnected, the pilot tone is injected through switch SW1 and coupler C1 as a received signal into mixers MR1 and MR2. In the example being used herein for explanation only, wherein the baseband frequency is assumed to be 5 megahertz and the broadcast frequency is assumed to be 5 gigahertz with the upper sideband of the broadcast signal being used for data communication purposes, a convenient pilot tone frequency for alignment of the received channel is 5 megahertz below the broadcast carrier frequency. The mixers MR1 and MR2 provide inphase and quadrature outputs through amplitude adjust circuits A1 and A2, typically to analog-to-digital converters in a DSP, not shown. The pilot tone will be downconverted to 5 megahertz. The digital signal processing circuit will detect the I/Q amplitude and phase mismatch from the signals IR and QR of FIG. 3, and the quadrature error of the 5 megahertz signal will be minimized by controlling the amplitude and phase adjust circuits iteratively as previously described to minimize the I and Q phase mismatch error.

Figure 4:
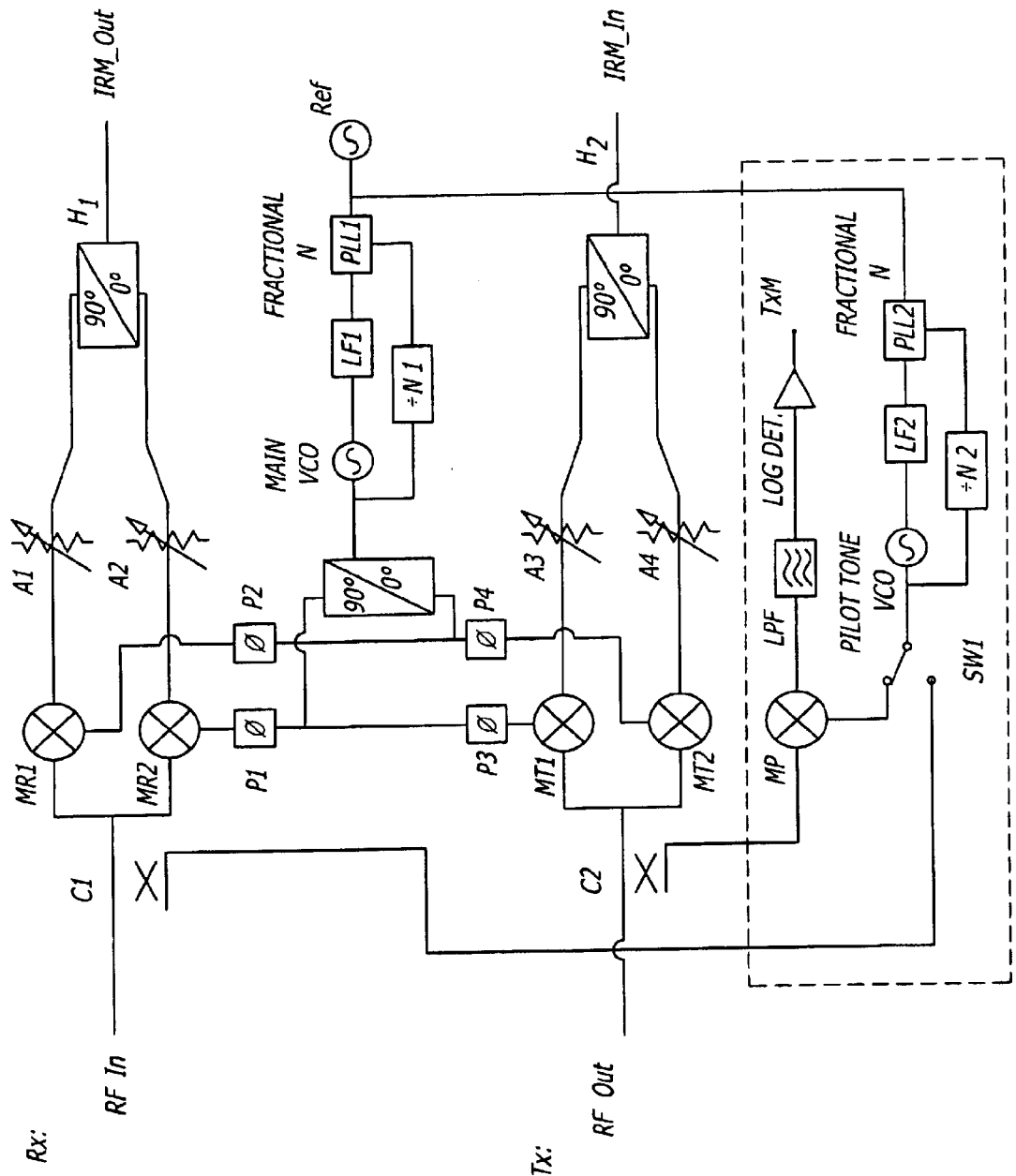
FIG. 4 is a block diagram similar to FIG. 3, though including quadrature combiner/dividers H1 and H2.

FIG. 4 is a block diagram similar to FIG. 3, though including intermediate frequency combiners/dividers H1 and H2. Combiner/divider H1 combines the inphase and quadrature signals output by mixers MR1 and MR2 into a single intermediate frequency received signal IRM_OUT. Combiner/divider H2 separates the inphase and quadrature signals from the intermediate frequency signal IRM_IN to provide the inphase and quadrature signals to the RF mixers MT1 and MT2. Of course, the pilot tone circuitry, the mixer MP, low pass filter LPF and log detector, if on chip, need only be turned on during the alignment process.

Figure 8:
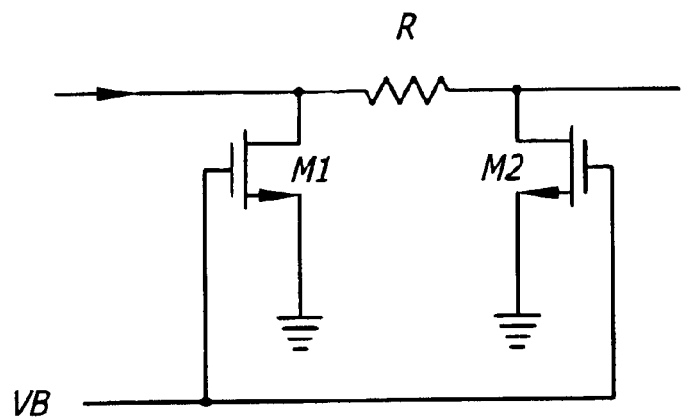
FIG. 8 is an exemplary circuit diagram of a voltage control of the amplitude of a signal.

As previously mentioned, the variable attenuators A1, A2, A3 and A4 in a preferred integrated circuit embodiment of the present invention are each responsive to a respective control voltage which may be provided, by way of example, by a DSP through digital to analog converters. An exemplary circuit with a voltage control of the amplitude is shown in FIG. 8. This circuit is simply a π network with a fixed pass resistor R and variable bypass resistors comprising matched MOS devices M1 and M2 acting as variable resistors controlled by the voltage VC on the common gate connection.

Figure 9:
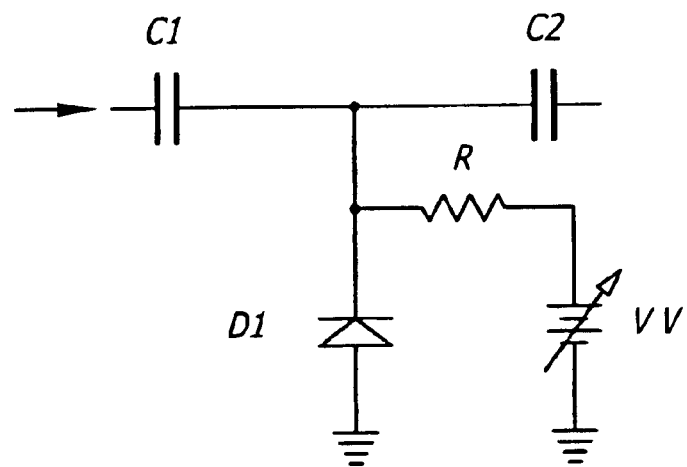
FIG. 9 is an exemplary circuit diagram of a voltage control of the phase of a signal.

The phase adjust circuits P1, P2, P3 and P4 may also be voltage controlled using a circuit substantially as shown in FIG. 9. As shown therein, AC coupling capacitors C1 and C2 form a T network with a variable capacitor comprising a varactor D1 in the leg of the T, the varactor being back biased or at least biased below the forward conduction voltage of the varactor by a variable voltage VV. The capacitance of the varactor is dependent upon the voltage VV across the varactor, controlled by the control voltage VV applied to the cathode of the varactor through resistor R, the resistor preferably having a sufficiently high resistance to not significantly affect the phase shift provided by the circuit. For desensitizing the circuit, a fixed capacitor (not shown) may be placed in parallel with the varactor. Of course the circuits of FIGS. 8 and 9 are exemplary only, as other amplitude and phase adjust circuits may be used as desired. Like the variable attenuators A1, A2, A3 and A4, the phase adjust circuits may each be responsive to a respective control voltage provided by a DSP through digital to analog converters.

As stated before, the present invention alignment methods and apparatus for I/Q (inphase and quadrature) phase and amplitude error correction and image rejection improvement may be used in various ways. By way of example, the invention may be used in portable communication devices for alignment of the transmission and receive channels each time the portable communication device is turned on. Alternatively, the invention may be used for alignment of transmit and receive channels each time the respective channel is switched on. In that regard, the alignment process itself in accordance with the present invention may be completed very rapidly, usually under processor or DSP control, thereby not occupying significant transmit and receive time. The present invention may also be used for one-time phase and amplitude error correction and image rejection improvement at the time of integrated circuit manufacture, making permanent corrections through techniques such as, by way of example, laser trimming. The one-time phase and amplitude adjustment allows some of the circuits for the adjustment such as the transmit mismatch monitoring circuit and pilot tone generating circuit to be off-chip, reducing the integrated circuit complexity. However it does not provide for compensation of circuit drifts with time and temperature, and does not provide for compensation of the transmit and receive channels at the specific channel frequency being used. In that regard, the present invention error correction may be carried out at the specific channel frequency being used, or alternatively at a fixed channel frequency, such as a midrange frequency.

It should be noted that in the present invention, both gains and both phase shifts in each of the transmit and receive channels are controlled variables adjusted during the alignment process. One amplitude and one phase in each channel could be fixed, with the other phase and amplitude being adjusted in accordance with the present invention to provide the desired orthogonality and amplitude matching in most systems.

Thus while certain preferred embodiments of the present invention have been disclosed herein, such disclosure is only for purposes of understanding exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A method of aligning an I/Q upconverter for minimizing an unwanted sideband comprising:

providing inphase and quadrature signals;

upconverting the inphase and quadrature signals using inphase and quadrature components of a carrier frequency to provide representative wanted and an unwanted sidebands;

downconverting the output of the upconversion and carrier leakage using a pilot tone having a second frequency as the local oscillator of the downconverter, the difference in the first and second frequencies placing the wanted and not the unwanted sideband and carrier leakage as downconverted at frequencies that may be filtered out with a low pass filter;

filtering out the wanted sideband and the carrier leakage; and, adjusting the amplitude of at least one of the inphase and quadrature signals and the phase of at least one of the inphase and quadrature components of the carrier frequency to minimize the unwanted sideband.

2. The method of claim 1 wherein the carrier frequency and the pilot tone are generated from a common reference frequency, and at least one of the carrier frequency and the pilot tone is generated using a fractional N phase locked loop.

3. The method of claim 1 wherein the carrier frequency and the pilot tone are generated from a common reference frequency, and the carrier frequency is generated using a fractional N phase locked loop.

4. The method of claim 1 wherein the carrier frequency and the pilot tone are generated from a common reference frequency, and the pilot tone is generated using a fractional N phase locked loop.

5. The method of claim 1 wherein the adjusting is done by laser trimming at the time of integrated circuit manufacture.

6. The method of claim 1 wherein the amplitude and phase adjustments are made electronically during the upconverter I/Q mismatch calibration.

7. The method of claim 1 wherein the amplitude and phase adjustments are made iteratively.

8. The method of claim 1 wherein the carrier is an RF carrier.

9. The method of claim 1 wherein the inphase and quadrature signals are baseband or intermediate frequency sinusoidal signals.

10. The method of claim 9 wherein the difference in the first and second frequencies place the unwanted sideband at a low frequency close to DC and the wanted sideband and carrier leakage are filtered out using a low pass filter.

11. The method of claim 10 wherein the amplitude of at least one of the inphase and quadrature signals and the phase of at least one of the inphase and quadrature components of a carrier frequency are adjusted to minimize the power in the unwanted sideband.

12. The method of claim 11 wherein the carrier is an RF carrier.

13. The method of claim 9 wherein the inphase and quadrature signals are provided by providing an intermediate frequency sinusoidal signal to a quadrature divider.

14. The method of claim 13 wherein the difference in the first and second frequencies place the unwanted sideband at a low frequency close to DC and the wanted sideband and carrier leakage are filtered out using a low pass filter.

15. The method of claim 14 wherein the amplitude of at least one of the inphase and quadrature signals and the phase of at least one of the inphase and quadrature components of a carrier frequency are adjusted to minimize the power in the unwanted sideband.

16. The method of claim 15 wherein the carrier is an RF carrier.

17. Apparatus for aligning an upconverter for receiving inphase and quadrature components of a signal and upconverting the inphase and quadrature components of the signal using inphase and quadrature components of a carrier frequency to provide a wanted sideband comprising:

an amplitude adjust circuit for adjusting the amplitude of at least one of the inphase and quadrature components of the signal;

a phase adjust circuit for adjusting the phase of at least one of the inphase and quadrature components of the carrier;

a pilot tone generator for generating a pilot tone having a frequency having a predetermined relationship with the frequency of the carrier;

a downconverter for downconverting the output of the upconverter using the pilot tone as its local oscillator, the difference in the pilot tone frequency and the carrier frequency placing the wanted and not the unwanted sideband and carrier leakage as downconverted at a frequency that may be filtered out;

a filter for filtering out the wanted sideband and carrier leakage from the output of the downconverter; and, circuitry to sense the unwanted sideband in the output of the filter;

whereby the amplitude adjust and the phase adjust circuits may be adjusted to minimize the unwanted sideband in the output of the filter.

18. The apparatus of claim 17 further including phase-locked loops generating the carrier frequency and the pilot tone from a common reference frequency, at least one of the phase-locked loops being a fractional N phase-locked loop.

19. The apparatus of claim 17 further including phase-locked loops generating the carrier frequency and the pilot tone from a common reference frequency, the phase-locked loop generating the carrier frequency being a fractional N phase-locked loop.

20. The apparatus of claim 17 further including phase-locked loops generating the carrier frequency and the pilot tone from a common reference frequency, the phase-locked loop generating the pilot tone being a fractional N phase-locked loop.

21. The apparatus of claim 17 wherein the filter is a low pass filter.

22. The apparatus of claim 17 wherein circuitry to sense the unwanted sideband in the output of the low pass filter comprises circuitry to sense the power in the output of the low pass filter.

23. The apparatus of claim 17 further comprising a quadrature divider generating the inphase and quadrature components of the intermediate frequency signal.

24. The apparatus of claim 23 wherein the filter is a low pass filter.

25. The apparatus of claim 23 wherein circuitry to sense the unwanted sideband in the output of the low pass filter comprises circuitry to sense the power in the output of the low pass filter.

26. Apparatus for aligning an upconverter for receiving inphase and quadrature components of a signal and upconverting the inphase and quadrature components of the signal using inphase and quadrature components of a carrier frequency to provide a wanted sideband comprising:

amplitude adjust means for adjusting the amplitude of at least one of the inphase and quadrature components of the signal;

phase adjust means for adjusting the phase of at least one of the inphase and quadrature components of the carrier;

pilot tone generating means for generating a pilot tone having a frequency having a predetermined relationship with the frequency of the carrier;

downconversion means for downconverting the output of the upconverter using the pilot tone, the difference in the pilot tone frequency and the carrier frequency placing the wanted and not the unwanted sideband and carrier leakage as downconverted at frequencies that may be filtered out;

filter means for filtering out the wanted sideband and carrier leakage from the output of the downconversion means; and, means for sensing the unwanted sideband in the output of the filter means;

whereby the amplitude adjust and the phase adjust means may be adjusted to minimize the unwanted sideband in the output of the filter means.

27. The apparatus of claim 26 further comprised of phase-locked loops generating the carrier frequency from a common reference frequency, at least one of the phase-locked loops being a fractional N phase-locked loop.

28. The apparatus of claim 26 further comprised of phase-locked loops generating the carrier frequency from a common reference frequency, the phase-locked loop generating the carrier frequency being a fractional N phase-locked loop.

29. The apparatus of claim 26 further comprised of phase-locked loops generating the carrier frequency from a common reference frequency, the phase-locked loop generating the pilot tone being a fractional N phase-locked loop.

30. The apparatus of claim 26 wherein the filter means is a low pass filter means.

31. The apparatus of claim 26 wherein means for sensing the unwanted sideband in the output of the low pass filter means comprises means for sensing the power in the output of the low pass filter means.

32. The apparatus of claim 26 further comprising a quadrature divider means for generating the inphase and quadrature components of the intermediate frequency signal.

33. The apparatus of claim 32 wherein the filter means is a low pass filter means.

34. The apparatus of claim 32 wherein the means for sensing the unwanted sideband in the output of the low pass filter means comprises means for sensing the power in the output of the low pass filter means.

35. A method of aligning an I/Q downconverter, the downconverter to recover the inphase and quadrature components of a baseband frequency signal in a desired sideband of a signal input to the downconverter using inphase and quadrature components of a carrier signal, comprising:

injecting a pilot tone into the input of the downconverter, the pilot tone having a frequency which on downconversion, provides inphase and quadrature signals at the baseband frequency; and, adjusting the amplitude of at least one of the inphase and quadrature signals and the phase of at least one of the inphase and quadrature components of the carrier frequency to minimize the difference in the amplitudes of the inphase and quadrature signals and to minimize the non-orthogonality of the inphase and quadrature signals.

36. The method of claim 35 wherein the carrier frequency and the pilot tone are generated from a common reference frequency, and at least one of the carrier frequency and the pilot tone is generated using a fractional N phase locked loop.

37. The method of claim 35 wherein the carrier frequency and the pilot tone are generated from a common reference frequency, and the carrier frequency is generated using a fractional N phase locked loop.

38. The method of claim 35 wherein the carrier frequency and the pilot tone are generated from a common reference frequency, and the pilot tone is generated using a fractional N phase locked loop.

39. The method of claim 35 wherein the adjusting is done by laser trimming at the time of integrated circuit manufacture.

40. The method of claim 35 wherein the amplitude and phase adjustments are made electronically during the downconverter I/Q mismatch calibration.

41. The method of claim 35 wherein the amplitude and phase adjustments are made iteratively.

42. The method of claim 35 wherein the pilot tone is a sinusoidal signal.

43. The method of claim 35 wherein the carrier is an RF carrier.

44. A method of aligning an image rejection mixer downconverter, the downconverter to produce the inphase and quadrature components of an intermediate frequency signal by injecting an image signal at the downconverted input using inphase and quadrature components of a carrier signal, comprising:

injecting a pilot tone into the input of the downconverter in the image band, the pilot tone having a frequency which on downconversion, provides inphase and quadrature signals at the intermediate frequency;

combining the inphase and quadrature signals with a quadrature combiner; and, adjusting the amplitude of at least one of the inphase and quadrature signals and the phase of at least one of the inphase and quadrature components of the carrier frequency to minimize the output of the quadrature converter.

45. The method of claim 44 wherein the carrier frequency and the pilot tone are generated from a common reference frequency, and at least one of the carrier frequency and the pilot tone is generated using a fractional N phase locked loop.

46. The method of claim 44 wherein the carrier frequency and the pilot tone are generated from a common reference frequency, and the carrier frequency is generated using a fractional N phase locked loop.

47. The method of claim 44 wherein the carrier frequency and the pilot tone are generated from a common reference frequency, and the pilot tone is generated using a fractional N phase locked loop.

48. The method of claim 44 wherein the adjusting is done by laser trimming at the time of integrated circuit manufacture.

49. The method of claim 44 wherein the amplitude and phase adjustments are made electronically during the downconverter I/Q mismatch calibration.

50. The method of claim 44 wherein the amplitude and phase adjustments are made iteratively.

51. The method of claim 44 wherein the pilot tone is a sinusoidal signal.

52. The method of claim 44 wherein the carrier is an RF carrier.

53. Apparatus for aligning an I/Q downconverter, the downconverter to recover the inphase and quadrature components of a baseband frequency signal in a desired sideband of a signal input to the downconverter using inphase and quadrature components of a carrier signal, comprising:

circuitry for generating a pilot tone which is different in frequency from the carrier frequency to generate baseband signals;

circuitry for injecting a pilot tone into the input of the downconverter to provide inphase and quadrature signals at the baseband frequency;

amplitude adjust circuitry for adjusting the amplitude of at least one of the inphase and quadrature signals; and, phase adjust circuitry for adjusting the phase of at least one of the inphase and quadrature components of the carrier;

whereby the difference in the amplitudes of the inphase and quadrature signals may be minimized and the non-orthogonality of the inphase and quadrature signals may be minimized.

54. The apparatus of claim 53 further including circuitry for generating the carrier frequency, wherein the circuitry for generating the pilot tone and the carrier frequency utilizes a common reference frequency and includes at least one fractional N phase-locked loop.

55. The apparatus of claim 53 further including circuitry for generating the carrier frequency, wherein the circuitry for generating the pilot tone and the carrier frequency utilizes a common reference frequency, and the circuitry for generating the pilot tone comprises a fractional N phase-locked loop.

56. Apparatus for aligning an image rejection mixer downconverter, the downconverter to produce the inphase and quadrature components of an intermediate frequency signal by injecting an image signal at the downconverted input using inphase and quadrature components of a carrier signal, comprising:

circuitry for generating a pilot tone which is different in frequency from the carrier frequency and in the image band to generate intermediate frequency signals;

circuitry for injecting a pilot tone in the image band into the input of the downconverter to provide inphase and quadrature signals at the intermediate frequency;

circuitry for quadrature combining the inphase and quadrature signals to provide a combined signal due to I/Q mismatch;

amplitude adjust circuitry for adjusting the amplitude of at least one of the inphase and quadrature signals; and, phase adjust circuitry for adjusting the phase of at least one of the inphase and quadrature components of the carrier;

whereby the combined signal may be minimized.

57. The apparatus of claim 56 further including circuitry for generating the carrier frequency, wherein the circuitry for generating the pilot tone and the carrier frequency utilizes a common reference frequency and includes at least one fractional N phase-locked loop.

58. The apparatus of claim 56 further including circuitry for generating the carrier frequency, wherein the circuitry for generating the pilot tone and for generating the carrier frequency utilizes a common reference frequency, and the circuitry for generating the carrier frequency comprises a fractional N phase-locked loop.

59. The apparatus of claim 56 further including circuitry for generating the carrier frequency, wherein the circuitry for generating the pilot tone and for generating the carrier frequency utilizes a common reference frequency, and the circuitry for generating the pilot tone comprises a fractional N phase-locked loop.

60. Apparatus for aligning an I/Q downconverter, the downconverter to recover the inphase and quadrature components of a baseband frequency signal in a desired sideband of a signal input to the downconverter using inphase and quadrature components of a carrier signal, comprising:

means for generating a pilot tone which is different in frequency from the carrier frequency to generate baseband signals;

means for injecting a pilot tone into the input of the downconverter to provide inphase and quadrature signals at the baseband frequency;

amplitude adjust means for adjusting the amplitude of at least one of the inphase and quadrature signals; and, phase adjust means for adjusting the phase of at least one of the inphase and quadrature components of the carrier;

whereby the difference in the amplitudes of the inphase and quadrature signals may be minimized and the non-orthogonality of the inphase and quadrature signals may be minimized.

61. The apparatus of claim 60 further including means for generating the carrier frequency, wherein the means for generating the pilot tone and the means for generating the carrier frequency utilize a common reference frequency and includes at least one fractional N phase-locked loop.

62. The apparatus of claim 60 further including means for generating the carrier frequency, wherein the means for generating the pilot tone and the means for generating the carrier frequency utilize a common reference frequency, and the means for generating the carrier frequency comprises a fractional N phase-locked loop.

63. The apparatus of claim 60 further including means for generating the carrier frequency, wherein the means for generating the pilot tone and the means for generating the carrier frequency utilize a common reference frequency, and the means for generating the pilot tone comprises a fractional N phase-locked loop.

64. Apparatus for aligning an image rejection mixer downconverter, the downconverter to produce the inphase and quadrature components of an intermediate frequency signal by injecting an image signal at the downconverted input using inphase and quadrature components of a carrier signal, comprising:

means for generating a pilot tone which is different in frequency from the carrier frequency in the image band to generate intermediate frequency signals;

means for injecting a pilot tone into the input of the downconverter to provide inphase and quadrature signals at the intermediate frequency;

means for quadrature combining the inphase and quadrature signals to provide a combined signal due to I/Q mismatch;

amplitude adjust means for adjusting the amplitude of at least one of the inphase and quadrature signals; and, phase adjust means for adjusting the phase of at least one of the inphase and quadrature components of the carrier;

whereby the combined signal may be minimized.

65. The apparatus of claim 64 further including means for generating the carrier frequency, wherein the means for generating the pilot tone and the means for generating the carrier frequency utilize a common reference frequency and includes at least one fractional N phase-locked loop.

66. The apparatus of claim 64 further including means for generating the carrier frequency, wherein the means for generating the pilot tone and the means for generating the carrier frequency utilize a common reference frequency, and the means for generating the carrier frequency comprises a fractional N phase-locked loop.

67. The apparatus of claim 64 further including means for generating the carrier frequency, wherein the means for generating the pilot tone and the means for generating the carrier frequency utilize a common reference frequency, and the means for generating the pilot tone comprises a fractional N phase-locked loop.

* * * * *